United States Patent [19]

Lin et al.

[11] Patent Number: 5,648,297
[45] Date of Patent: Jul. 15, 1997

[54] LONG-WAVELENGTH PTSI INFRARED DETECTORS AND METHOD OF FABRICATION THEREOF

[75] Inventors: True-Lon Lin, Cerritos; Jin S. Park, Gardena; Sarath D. Gunapala, Valencia; Eric W. Jones, Los Angeles; Hector M. Del Castillo, Pasadena, all of Calif.

[73] Assignee: The United States of America as represented by the Administrator of the National Aeronautics and Space Administration, Washington, D.C.

[21] Appl. No.: 646,795

[22] Filed: May 21, 1996

Related U.S. Application Data

[60] Division of Ser. No. 342,455, Nov. 17, 1994, abandoned, which is a continuation-in-part of Ser. No. 247,959, May 23, 1994, abandoned.

[51] Int. Cl.$^6$ .......................... H01L 31/00; H01L 21/44
[52] U.S. Cl. .................. 437/178; 437/103; 437/106; 437/175; 437/225; 437/245; 257/449; 257/451; 257/455
[58] Field of Search ...................... 257/451, 449, 257/455; 437/225, 245, 106, 103, 175, 178, 916

[56] References Cited

U.S. PATENT DOCUMENTS

| | | |
|---|---|---|
| 4,374,012 | 2/1983 | Adlerstein . |
| 4,533,933 | 8/1985 | Pellegrini et al. . |
| 4,544,939 | 10/1985 | Kosonocky et al. . |
| 4,559,091 | 12/1985 | Allen et al. . |
| 4,586,069 | 4/1986 | Koniger et al. ......................... 257/455 |
| 4,806,502 | 2/1989 | Jorke et al. . |
| 4,908,686 | 3/1990 | Maserjian . |
| 4,929,064 | 5/1990 | Schubert . |
| 5,023,685 | 6/1991 | Bethea et al. . |
| 5,132,763 | 7/1992 | Maserjian . |
| 5,161,235 | 11/1992 | Shur et al. . |
| 5,163,179 | 11/1992 | Pelligrini ................................ 257/451 |
| 5,241,197 | 8/1993 | Murakami et al. . |
| 5,285,098 | 2/1994 | Borrello . |

OTHER PUBLICATIONS

Fathauer et al, Proc. SPIE, vol. 877, pp. 2–7 Jan. 1988.

Infrared Technology XVII, edited by I.J. Spiro, B.F. Andresen and M. Scholl, Proc; SPIE, vol. 1540, pp. 285–296 (1991) by D. J. Sauer, F.V. Shallcross, F.L. Hsueh, G.M. Meray, P.A. Levine, H.R. Gilmartin, T.S. Villani, B.J. Esposito, and J.R. Tower no month.

Infrared Technology XVII, edited by B.F. Andresen, M. Scholl and I.J. Spiro, Proc. SPIE, VOL. 1540, PP. 297–302 (1991) A. Hoffman and D. Randall no month.

Infrared Technology XVII, edited by B.F. Andresen, M. Scholl and I. J. Spiro, Proc. SPIE, vol. 1540, pp. 303–311 (1991) by D.L. Clark, J.R. Berry, G.L. no month Compagna, M.A. Cosgrove, G.G. Furman, J.R. Heydweilier, H. Honickman, R.A. Rehberg, P.H. Solie, and E.T. Nelson no date.

"High Performance 1040 × 1040 Element PtSi Schottky–Barrier Image Sensor", Infrared Technology XVIII, edited by B.F. Andresen and F.D. Shepererd, Proc. SPIE, vol. 1762, (1992) by M. Kimata, N. Yutani and S.N. Tsubouchi no month.

(List continued on next page.)

*Primary Examiner*—Edward Wojciechowicz
*Attorney, Agent, or Firm*—John H. Kusmiss

[57] ABSTRACT

Extended cutoff wavelengths of PtSi Schottky infrared detectors in the long wavelength infrared (LWIR) regime have been demonstrated for the first time. This result was achieved by incorporating a 1-nm-thick p+ doping spike at the PtSi/Si interface. The extended cutoff wavelengths resulted from the combined effects of an increased electric field near the silicide/Si interface due to the p+ doping spike and the Schottky image force. The p+ doping spikes were grown by molecular beam epitaxy at 450 degrees Celsius using elemental boron as the dopant source, with doping concentrations ranging from $1\times10^{19}$ to $1\times10^{21}$ cm$^{-3}$. The cutoff wavelengths were shown to increase with increasing doping concentrations of the p+ spikes.

12 Claims, 6 Drawing Sheets

OTHER PUBLICATIONS

S.M. Size, Physics of Semiconductor Devices (Wiley, New York, 1981), Chap. 5.

J.M. Shannon, Appl. Phys. Lett., 24, 369 (1974) no month.

C-Y. Wei, W. Tantraporn, W. Katz and G. Smith, Thin Solid Films, 93, 407 (1982).

W.C. Ballamy and Y. Ota, Appl. Phys. Lett. 39, 629 (1981) no month.

R.W. Fathauer, T.L. Lin, P.J. Grunthaner, J. Maserjian, and P.O. Andersson, Proc. SPIE, vol. 877, Innovative Science and Technology, edited by C. Kukkonen pp. 2–7, (SPIE, Bellingham, 1988) no month.

C.P. Parry, S.M. Newstead, R.D. Barlow, P. Augustus, R.A.A. Kubiak, M.G. Dowse.

T.E. Whall and E.H. C. Parker, Appl. Phys. Lett., 58, 181 (1991) no month.

I.L. Lin, I. George, E.W. Jones and A. Ksendzov, Appl. Phys. Lett., 60, 380.

P.J. Grunthaner, F.J. Grunthaner, R.W. Fathauer, T.L. Lin, F.D. Schowengerdt, M.H. Hecht, D. Bell, W. Kaiser and J. H. Mazur, Thin Solid Films, 183, 197 (198 ).

F.D. Shepherd, Proc. SPIE, vol. 1735, Infrared Detectors: State of the Art, edited by W.H. Makky, pp. 250–261 (SPIE, Bellingham, 1992) no month.

LONG-WAVELENGTH PTSI INFRARED DETECTORS AND METHOD OF FABRICATION THEREOF

This is a division of application Ser. No. 08/342,455, filed Nov. 17, 1994 now abandoned which is a continuation in part of Ser. No. 08/247,959 filed May 23, 1994, now abandoned.

ORIGIN OF INVENTION

The invention described herein was made in the performance of work under a NASA contract, and is subject to the provisions of Public Law 96-517 (35 USC 202) in which the Contractor has elected not to retain title.

TECHNICAL FIELD

The invention relates generally to the field of infrared detectors and more specifically, to a LWIR detector having an extended cutoff wavelength useful for large infrared focal plane arrays and for industrial and governmental night vision applications.

BACKGROUND ART

Silicide Schottky-barrier detectors are among the most promising infrared sensors for large focal plane array applications due to their advantages of uniformity, reliability, and low cost. State-of-the-art silicide PtSi focal plane arrays are used for imaging in the 3–5 μm medium wavelength infrared (MWIR) region. 640×480 and 1024×1024 element PtSi imaging arrays have been demonstrated:

Infrared Technology XVII, edited by I. J. Spiro, B. F. Andresen and M. Scholl, Proc. SPIE, Vol. 1540, pp. 285–296 (1991) by D. J. Sauer, F. V. Shallcross, F. L. Hsueh, G. M. Meray, P. A. Levine, H. R. Gilmartin, T. S. Villani, B. J. Esposito, and J. R. Tower;

Infrared Technology XVII, edited by B. F. Andresen, M. Scholl and I. J. Spiro, Proc. SPIE, Vol. 1540, pp. 297–302 (1991) by J. L. Gates, W. G. Connelly, T. D. Franklin, R. E. Mills, F. W. Price and T. Y. Wittwer;

Infrared Technology XVII, edited by B. F. Andresen, M. Scholl and I. J. Spiro, Proc. SPIE, Vol. 1540, pp. 303–311 (1991) by D. L. Clark, J. R. Berry, G. L. Compagna, M. A. Cosgrove, G. G. Furman, J. R. Heydweiller, H. Honickman, R. A. Rehberg, P. H. Solie, and E. T. Nelson;

"High Performance 1040×1040 Element PtSi Schottky-Barrier Image Sensor", Infrared Technology XVIII, edited by B. F. Andresen and F. D. Shepererd, Proc. SPIE, Vol. 1762, (1992) by M. Kimata, N. Yutani and S. N. Tsubouchi.

The PtSi spectral response follows the Fowler dependence, and its quantum efficiency (QE) is given by $$QE = C_1 \frac{(hv - q\phi_B)^2}{hv} = 1.24 \, C_1 \lambda \left( \frac{1}{\lambda} - \frac{1}{\lambda_c} \right)^2 \quad (1)$$

where $C_1$ is the emission coefficient, $hv$ and $\lambda$ are the energy and the wavelength of the incident photon, respectively, $q\phi_B$ is the Schottky barrier height, and $\lambda_c$ is the cutoff wavelength, given by $$\lambda_c = \frac{1.24}{q\phi_B} \quad (2)$$

The Schottky barrier height of the PtSi detector is ~0.22 eV, corresponding to a cutoff wavelength of ~5.6 μm. Due to the Fowler dependence, the QE of the PtSi detector in the 3–5 μm MWIR regime is relatively low.

There is a great interest in extending the PtSi cutoff wavelength for long wavelength infrared (LWIR) operation in the 8–14 μm regime and for improved MWIR performance. The Schottky barrier height is determined by the combined effects of the image-force effect and the electric field of the depletion region. Consequently, the effective PtSi Schottky barrier height can be reduced by introducing a thin p-type doped layer at the silicide/Si interface (S. M. Sze, Physics of Semiconductor Devices, Wiley, New York, 1981, Chap. 5). Due to the enhanced electric field of the doping spike, a potential spike near the PtSi/Si interface was formed, allowing photo-excited holes to tunnel into the substrate, resulting in a lower effective potential barrier. Previously, very shallow ion implants at the metal-silicon interface, first demonstrated by Shannon (J. M. Shannon, Appl. Phys. Lett., 24, 369, 1974), have been employed by Pellegrini et al. and Wei et al. to extend the PtSi cutoff wavelength (P. Pellegrini, M. Week, and C. E. Ludington, Proc. SPIE, Vol. 311, Mosaic Focal Plane Methodologies II, edited by Chan and Hall, pp. 24–29, 1981; and C. Y. Wei, W. Tantraporn, W. Katz, and G. Smith, Thin Solid Films, 93, 407, 1982). More recently, molecular beam epitaxy (MBE) was used to grow the thin doping spikes to reduce the Schottky barriers of Ti/Si (W. C. Ballamy and Y. Ota, Appl. Phys. Lett., 39, 629, 1981) and CoSi/Si$_2$ (R. W. Fathauer, T. L. Lin, P. J. Grunthaner, J. Maserjian, and P. O. Anderson, Proc. SPIE, Vol. 877, Innovative Science and Technology, edited by C. Kukkonen, pp. 2–7, 1988. However, the additional tunneling process required for the collection of photo-excited carriers reduces the detector response. Furthermore, due to the limited abruptness of the implanted doping spike profile, the electric field near the doping spike was increased drastically, resulting in a significantly increased contribution of tunneling current to the detector dark current.

The following U.S. Patents are related to the invention:

U.S. Pat. No. 4,533,933 Pellegrini et al
U.S. Pat. No. 4,374,012 Adlerstein
U.S. Pat. No. 4,544,939 Kosonocky et al
U.S. Pat. No. 4,559,091 Allen et al
U.S. Pat. No. 4,806,502 Jorke et al
U.S. Pat. No. 4,908,686 Maserjian
U.S. Pat. No. 4,929,064 Schubert
U.S. Pat. No. 5,023,685 Bethea et al
U.S. Pat. No. 5,132,763 Maserjian
U.S. Pat. No. 5,161,235 Shur et al
U.S. Pat. No. 5,163,179 Pellegrini
U.S. Pat. No. 5,241,197 Murakami et al
U.S. Pat. No. 5,285,098 Borrello Of the foregoing patents, the following are the most relevant:

U.S. Pat. No. 4,908,686 to Maserjian is directed to a PtSi infrared detector capable of operation in the long-wavelength region. Referring to FIGS. 2 and 3, you will note that the detector is formed with a Schottky-barrier structure wherein two silicon layers 12 sandwich a metal silicide layer 10. Of particular relevance, is the disclosure that a dopant spike 22 is introduced adjacent the silicon/silicide interface 16. The detector structure is formed utilizing a molecular beam epitaxy process with P+ doping. However, this design relies on tunneling of holes into the silicon which is a direct opposite of the teachings of the present invention.

U.S. Pat. No. 4,544,939 to to Kosonocky et al is directed to a long-wavelength infrared detector in the form of a Schottky-barrier diode. As shown in FIG. 2, the Schottky-barrier detector 10' includes a shallow ion implanted P+ layer 15 at the PtSi/Si interface, for lowering the barrier for the photoemission of carriers and thereby extending the long-wavelength spectra response of the detector. However, this disclosure also relies on tunneling (see column 4, line 64).

U.S. Pat. No. 5,132,763 to Maserjian is directed to an indium arsenide long-wave-infrared detector. Although not directed to PtSi devices, the reference discloses device fabrication utilizing MBE and a structure wherein the interface between adjacent layers 14' and 16' is doped utilizing "spike" doping.

U.S. Pat. No. 5,285,098 to Borrello is directed to a photoemission detector having increased quantum efficiency in the infrared range. The device is constructed utilizing a silicide film, which may be a platinum silicide, the device having a grooved structure formed by etching for increasing the absorption in the long-wavelengths. Further efficiency increase can be obtained by increasing the free-carrier absorption by higher P+ doping.

U.S. Pat. No. 4,929,064 to Schubert is directed to an optical modulator. Although not directed to a PtSi device, this opto-electronic device employs molecular-beam epitaxy for formation thereof and selective doping to form doping spikes.

STATEMENT OF THE INVENTION

The solution reported here utilizes a very thin p+ doping spike (10 Å thick) grown by MBE at the PtSi/Si interface. Due to the Schottky image force, the effective Schottky barrier is reduced without the formation of the potential spike, eliminating the undesirable tunneling process and all of the tunneling disadvantages. Advanced MBE growth technology was used for the formation of the thin p+ doping spike.

Extended cutoff wavelengths of PtSi Schottky infrared detectors in the long wavelength infrared (LWIR) regime have been demonstrated for the first time. This result was achieved by incorporating a 1-nm-thick p+ doping spike at the PtSi/Si interface. The extended cutoff wavelengths resulted from the combined effects of an increased electric field near the silicide/Si interface due to the p+ doping spike and the Schottky image force. The p+ doping spikes were grown by molecular beam epitaxy at 450 degrees Celsius using elemental boron as the dopant source, with doping concentrations ranging from $1 \times 10^{19}$ to $1 \times 10^{21}$ $cm^{-3}$. The cutoff wavelengths were shown to increase with increasing doping concentrations of the p+ spikes.

The detector cutoff wavelengths can be tailored by varying the doping concentrations of the p+ spikes. Cutoff wavelengths of 14, 18, and 22 µm have been demonstrated for doping-spike PtSi detectors. Thermionic emission I-V characteristics and Fowler-dependent photoresponses were observed for the doping-spike PtSi detectors, indicating the absence of an undesirable tunneling mechanism. Detector cutoff wavelengths can also be varied by varying the spike thickness such as from 0.7 to 1.1 nm which results in cutoff wavelengths ranging from 5.7 to 7.3 µm.

OBJECTS OF THE INVENTION

It is therefore a principal object of the present invention to provide a LWIR detector having up to a 22 µm cutoff wavelength.

It is another object of the invention to provide a method of fabricating an infrared detector having extended cutoff wavelengths in the long wavelength infrared region of the EM spectrum.

It is still another object of the invention to provide a LWIR PtSi detector using a MBE grown p+ doping spike wherein a very thin doping spike at the PtSi/Si interfaces eliminates undesirable tunneling.

BRIEF DESCRIPTION OF THE DRAWINGS

The aforementioned objects and advantages of the present invention, as well as additional objects and advantages thereof, will be more fully understood as a result of a detailed description of a preferred embodiment when taken in conjunction with the following drawings in which:

FIG. 1, comprising

FIG. 8, comprising FIGS. 8a, 8b and 8c, provides modified Fowler plots of $\sqrt{\eta h v}$ versus hv for three samples of doping-spike PtSi detectors at a reverse bias of 0.5 V.

DETAILED DESCRIPTION OF A PREFERRED EMBODIMENT

Figure 1A:
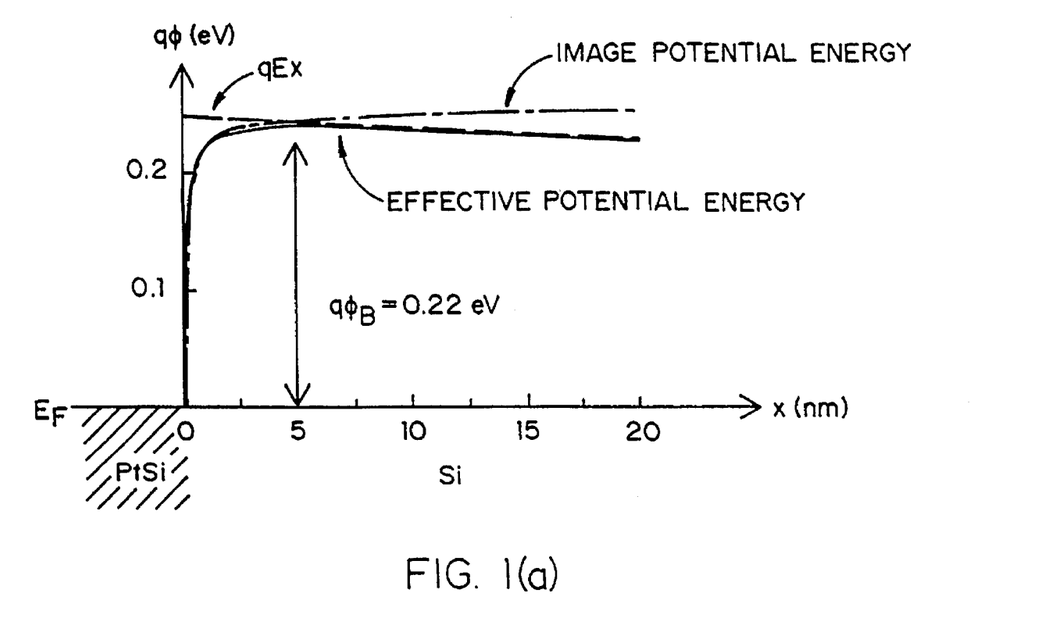
FIG. 1(a), FIG. 1(b) and FIG. 1(c), is a graphical illustration of calculated energy-band diagrams of three PtSi detectors without a doping spike, with a 5 nm thick spike and with a 1 nm thick spike, respectively.
Figure 1B:
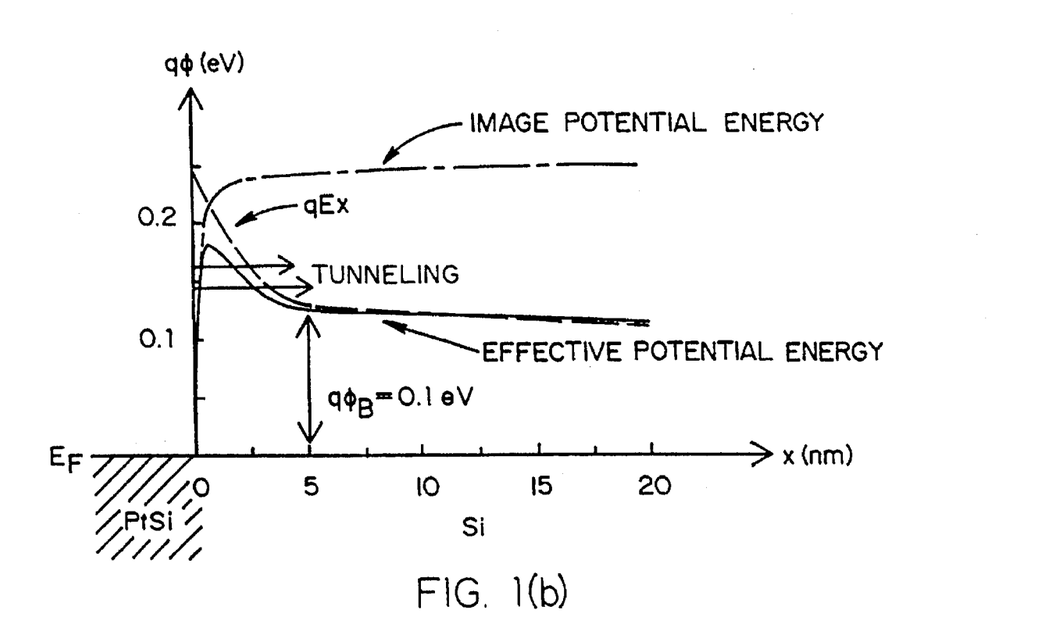
Figure 1C:
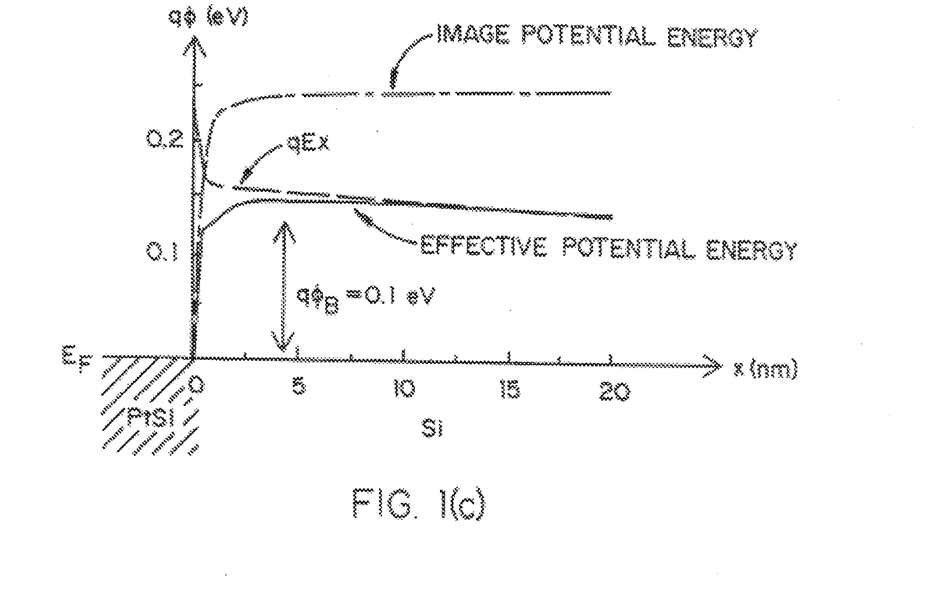

By reducing the doping spike thickness, the effective potential barrier can be reduced without the formation of a potential spike, eliminating the undesired tunneling process. The calculated energy-band diagrams of three PtSi detectors are shown in: FIG. 1(a) without the doping spike; FIG. 1(b) with a 5-nm-thick doping spike doped with $6 \times 10^{18}$ $cm^{-3}$ boron; and FIG. 1(c) with a 1-nm-thick doping spike doped with $1.2 \times 10^{20}$ $cm^{-3}$ boron. The substrate doping concentration is $5 \times 10^{14}$ $cm^{-3}$, and the bias voltage is -1 V for the calculation. The effective Schottky barrier heights for both doping-spike PtSi detectors are designed to be 0.1 eV. As shown in FIG. 1(b), the thicker doping spike (5 nm) results in the formation of a potential spike, and the tunneling process will be required for the collection of photo-excited holes. By reducing the doping spike thickness to 1 nm, with a corresponding increase of the doping concentration from $6 \times 10^{18}$ to $1.2 \times 10^{20}$ $cm^{-3}$, similar barrier reduction can be achieved without the formation of an undesired potential spike, as shown in FIG. 1(c), eliminating the undesirable tunneling process.

This thin doping spike approach requires the formation of ~1-nm-thick doping spikes with high doping concentrations and atomically abrupt doping profiles. This was made possible by the recent advances in the MBE technology, which allows the growth of degeneratively doped silicon layers with atomically sharp doping profiles at a low temperature (C. P. Parry, S. M. Newstead, R. D. Barlow, P. Augustus, R. A. A. Kubiak, M. G. Dowsett, T. E. Whall, and E. H. C. Parker, Appl. Phys. Lett., 58, 181, 1991; and T. L. Lin, T. George, E. W. Jones, and A. Ksendzov, Appl. Phys. Lett., 60, 380, 1992). The low growth temperature is essential to preserve the atomically sharp doping profiles to avoid the boron precipitation and surface segregation problems. In the present invention, extended LWIR cutoff wavelengths of PtSi Schottky infrared detectors were achieved by incorporating 1-nm-thick p+ doping spikes grown by MBE.

The PtSi Schottky detectors were fabricated on double-side polished Si (100) wafers with a resistivity of 30 Ω-cm. The device structure incorporates n-type guard rings which define the periphery of the active device areas to suppress edge leakage. Prior to MBE growth, the wafers were cleaned using the "spin-clean" method, which involves the removal of a chemically grown surface oxide using an HF/ethanol solution in a nitrogen glove box followed by annealing in the growth chamber of a commercial Riber EVA 32 Si MBE system at temperatures less than 500 degrees Celsius (P. J. Grunthaner, F. J. Grunthaner, R. W. Fathauer, T. L. Lin, F. D. Schowengerdt, M. H. Hecht, D. Bell, W. Kaiser, and J. H. Mazur, Thin Solid Films, 183,197, 1989). The 1-nm-thick p+-Si layers were grown by MBE at 450 degrees Celsius using elemental boron as the dopant source. Doping concentrations ranging from $1\times10^{19}$ to $1\times10^{21}$ cm$^{-3}$ were used. The PtSi layers were formed in-situ by depositing undoped Si and Pt followed by annealing at 400 degrees Celsius. The PtSi infrared detectors were characterized using current-voltage (I-V) measurements and photoresponse measurements. The material quality of the p+ doping spikes and the PtSi layers were characterized by cross-sectional transmission electron microscopy (TEM) using an ABT 002B 200 kV high resolution electron microscope. Cross-sectional TEM specimens were prepared using standard mechanical dimpling followed by Ar ion thinning.

Figure 2:
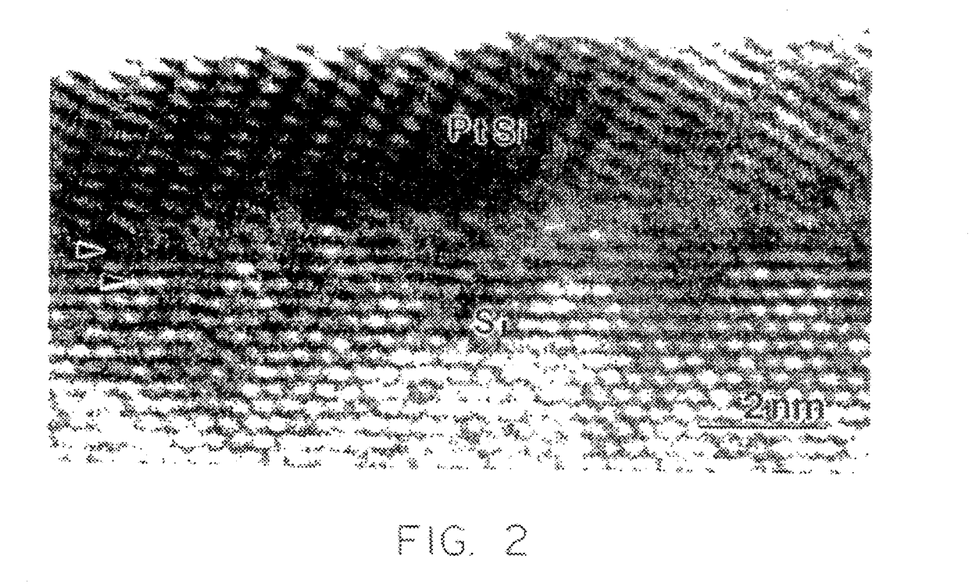
FIG. 2 is a photo-micrograph showing a cross-sectional TEM image of a doping-spike PtSi detector fabricated in accordance with the present invention.

FIG. 2 illustrates a cross-sectional TEM micrograph of a doping spike PtSi detector with a detector in accordance with the present invention. The thickness and the doping concentration of the p+ spike are 1 nm and $5\times10^{19}$ cm$^{-3}$, respectively, and the thickness of the PtSi layer is 2.4 nm. The PtSi layer has a uniform thickness and a reasonably flat interface with the underlying Si as indicated by the single arrow in FIG. 2. It is polycrystalline in nature with some grains exhibiting lattice fringes and moire-fringe patterns. No evidence was found for structural damage in the crystal due to the presence of the p+ layer.

Figure 3:
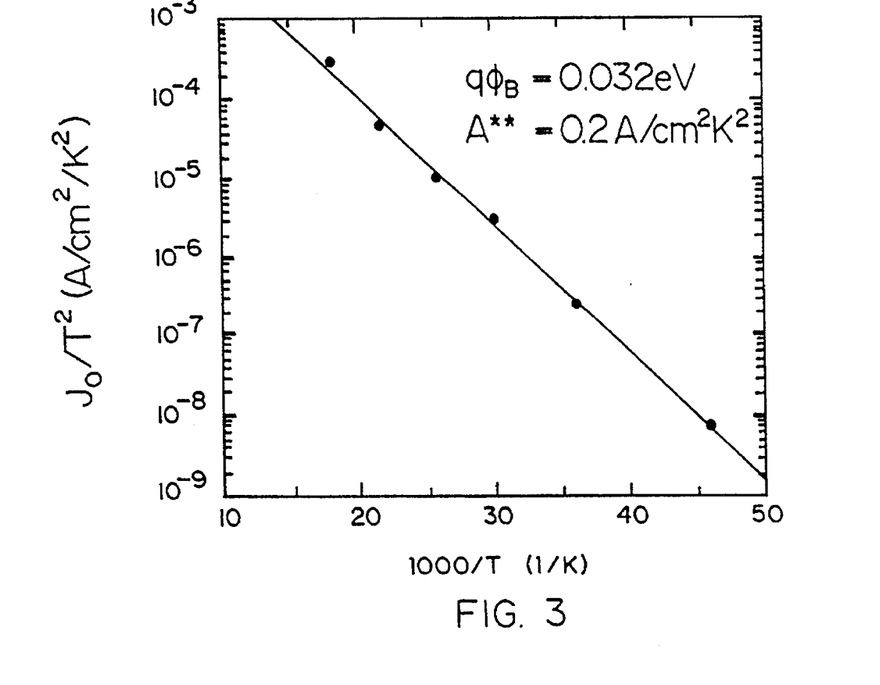
FIG. 3 is a Richardson plot of a typical doping-spike P+Si detector with a 22 µm cutoff wavelength.
Figure 4:
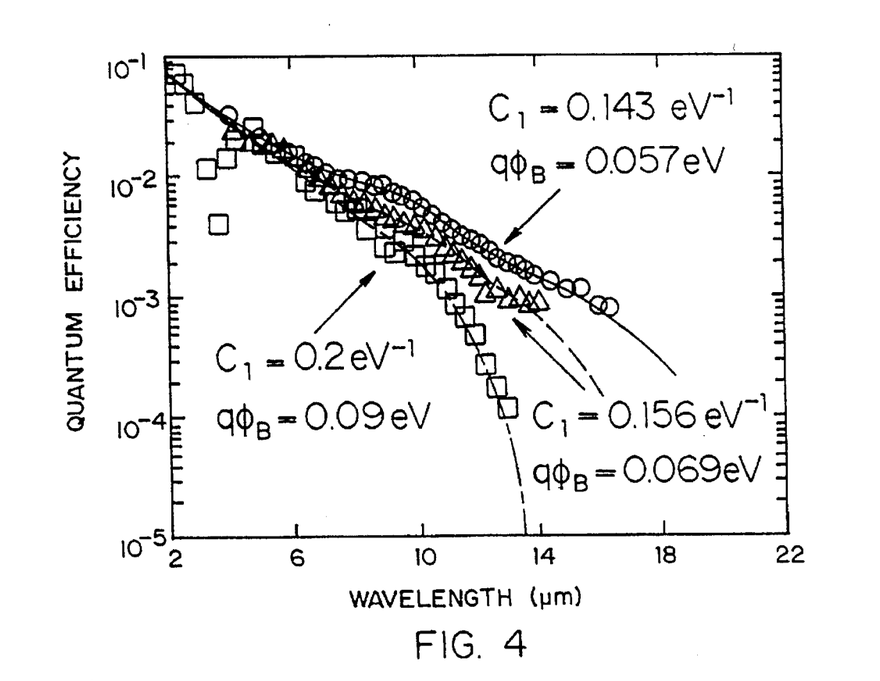
FIG. 4 is a graph of quantum efficiency versus wavelength for three doping-spike detectors in accordance with the present invention.

The dark currents of the doping-spike PtSi detectors were thermionic emission limited, given by $J_o=A^{}T^2 \exp(-q\phi_B/kT)$, where $J_o$ is the dark current density, $A^{}$ is the Richardson constant, T is the absolute temperature, $q\phi_B$ is the effective potential barrier, and k is the Boltzmann constant. FIG. 3 shows the typical plot of $J_o/T^2$ vs 1/kt for a doping-spike PtSi detector measured at −0.5 V reverse bias. The doping concentration of the 1-nm-thick p+ doping spike is $2\times10^{20}$ cm$^{-3}$. The cutoff wavelength of this detector determined by the Fowler plot is 22 µm, corresponding to a optical barrier height of 0.057 eV, as shown in FIG. 4. An effective barrier height, $q\phi_B$, of 0.032 eV was determined from the slope of the plot. The 0.025 eV discrepancy between the measured electrical and optical barrier heights is probably due to the scattering required for the internal photoemission process (F. D. Shepherd, Proc. SPIE, VOl. 1735, Infrared Detectors: State of the Art, 1992, to be published). No excess tunneling dark current was observed, indicating the absence of tunneling effect.

The detector spectral responses were measured with back-side illumination using a 940K blackbody source. FIG. 4 shows the responses of three doping-spike PtSi detectors at T=40 K. The thickness of the PtSi layers is 4nm and the doping concentrations of the 1-nm-thick doping spikes ranging from $1\times10^{20}$ cm$^{-3}$ to $2\times10^{20}$ cm$^{-3}$. The effective optical potential barriers of these detectors were determined by Fowler plots to be 0.09, 0.069, and 0.057 eV, corresponding to cutoff wavelengths of 14, 18, and 22 µm, respectively, with the Fowler coefficients $C_1$'s of 0.2, 0.156 and 0.143 eV$^{-1}$, respectively. A higher $C_1$ of 0.2 was observed for the 14 µm cutoff detector because an optical cavity was incorporated to enhance the infrared absorption. These $C_1$'s were comparable to those of conventional PtSi detectors with similar PtSi thicknesses, indicating the absence of the tunneling process in the internal photoemission process.

We have demonstrated that by incorporating a 1-nm-thick p+ doping spike at the PtSi/silicon interface, the PtSi cutoff wavelength can be extended to 22 µm. This doping-spike technique takes advantage of the strong Schottky image force within ~1 nm from the PtSi/Si interface. The barrier reduction $\Delta\psi$ is given approximately by $$\Delta\Psi = \frac{q}{2\epsilon_s} Nd^2, \qquad (3)$$

where N and d are the doping concentration and the thickness of the doping spike, respectively. Therefore, the effective potential barrier can be reduced by adjusting either the doping concentration or the thickness of the doping spikes. Cutoff wavelengths of 14, 18, and 22 µm have been previously demonstrated with thermionic emission limited I-V characteristics and Fowler-dependent photoresponses by increasing the doping concentration of the 1-nm-thick doping spike.

Thus, in accordance with the present invention, by incorporating a 1-nm-thick p+ doping spike at the PtSi/Si interface, we have successfully demonstrated extended cut-off wavelengths of PtSi Schottky infrared detectors in the long wavelength infrared (LWIR) regtime for the first time. The extended cutoff wavelengths resulted from the combined effects of an increased electric field near the silicide/Si interface due to the p+ doping spike and the Schottky image force. The p+ doping spikes were grown by molecular beam epitaxy at 450 degrees Celsius using elemental boron as the dopant source, with doping concentrations ranging from $1\times10^{19}$ to $1\times10^{21}$ cm$^{-3}$. Transmission electron microscopy indicated good crystalline quality of the doping spikes. The cutoff wavelengths were shown to increase with increasing doping concentrations of the p+ spikes. Thermionic emission dark current characteristics were observed and photo-response in the LWIR regime was demonstrated.

It has been reported that for the PtSi detector, the thermal potential barrier $\psi_T$ is usually 20–50 meV lower than the optical potential barrier $\psi_o$. The thermal potential barrier can be determined by the Richardson's plot, i.e., $$\ln\left(\frac{J_0}{T^2}\right) = -\frac{\Psi_t}{kT} + \ln(A^{**}), \qquad (4)$$

where $J_o$ is the dark current density, T is the absolute temperature, and $A^{**}$ is the Richardson constant. This discrepancy results from the fact that the photo-excited carriers suffer inelastic lattice scattering prior to the carrier emission. Therefore, a lower operating temperature is required for the PtSi detectors compared to detectors without the potential barrier discrepancy. This cooling penalty worsens as the cutoff wavelength increases and the potential discrepancy becomes comparable to the reduced potential barrier.

We have also determined that by varying the spike thickness from 0.7 to 1.1 nm, cutoff wavelengths ranging from 5.7 to 7.3 μm can be obtained using the doping-spike technique. Furthermore, by utilizing a new PtSi formating technique, which involves co-evaporating Pt and Si in a 1:1 ratio onto Si substrates heated at 450 degrees Celsius, the optical potential barriers $\psi_o$ (determined by the modified Fowler plots) were found in close agreement (difference <10 meV) with their thermal potential barriers $\psi_T$ (determined by the Richardson plots), resulting in a significant improvement in the detector dark current characteristics.

Three doping-spike PtSi detectors with spike thicknesses of 0.7 nm (sample A) 0.9 nm (sample B) and 1.1 nm (sample C) were fabricated on double-side polished Si (100) wafers with a resistivity of 30 Ω-cm. The boron doping concentration of these spikes was ~$5 \times 10^{19}$ cm$^{-3}$. The details of the MBE growth of the p+ doping spikes were given elsewhere. The 4-nm-thick PtSi layers were formed in-situ by co-evaporating Pt and Si in a 1:1 ratio onto the Si substrates heated at 450 degrees Celsius. The device structure incorporated n-type guard rings which define the periphery of the active device areas to suppress the edge leakage. Neither an anti-reflection coating nor an optical cavity was incorporated in these test devices.

Figure 5:
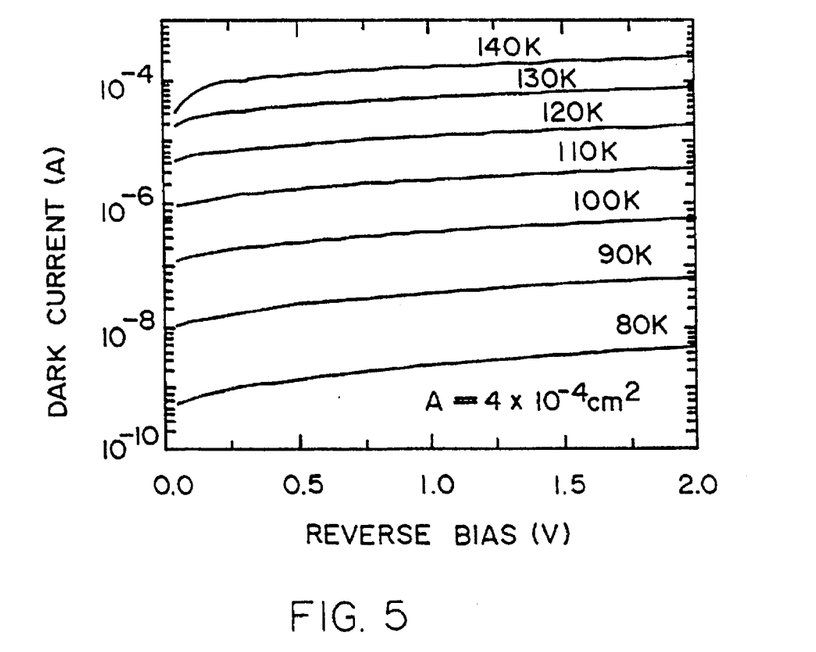
FIG. 5 is a graph of reverse dark current characteristics of a typical 7.3 µm cutoff doping-spike PtSi detector at temperatures ranging from 80 to 140 K. and an active detector area of $4 \times 10^{-4}$ $cm^2$.
Figure 6:
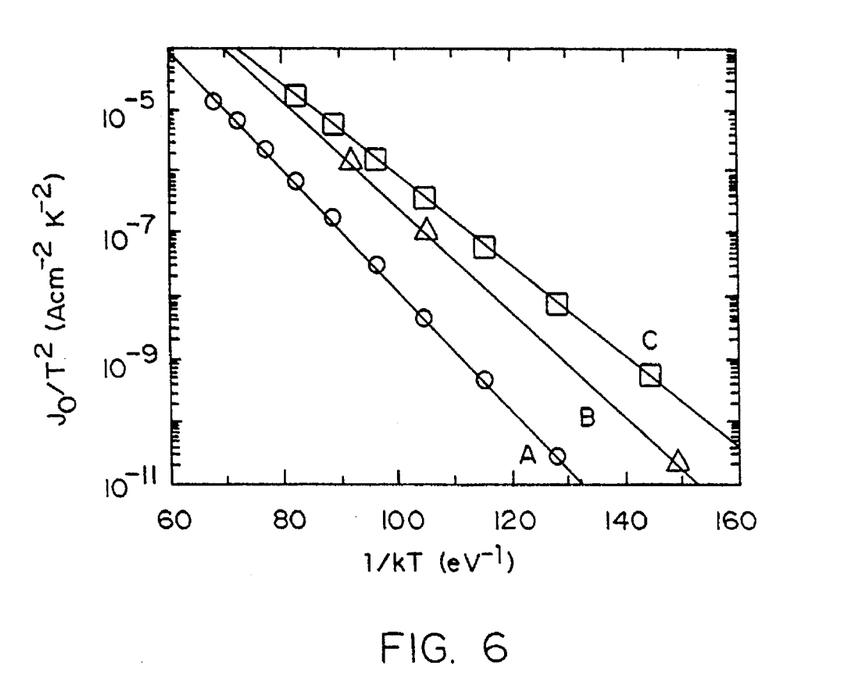
FIG. 6 is a graph of Richardson plots for the doping-spike PtSi detectors biased at -0.5 V and where spike thickness for A, B and C samples are 0.7, 0.9 and 1.1 nm, respectively.

FIG. 5 shows the typical dark current characteristics of the PtSi detector with a 1.1-nm-thick doping spike (sample C) at temperatures ranging from 80 to 140 K. The active device area is $4 \times 10^{-4}$ cm$^2$. Thermionic-emission limited current characteristics were clearly observed, indicating the absence of tunneling effects. The Richardson plots of the three doping-spike PtSi detector samples at −0.5 V bias are shown in FIG. 6. Thermal potential barriers $\psi_T$ of 0.218, 0.193, and 0.166 eV were determined by Equation 4 or using the above equation for dark current density where $\psi_T = 9\phi B$ for sample A, B, and C, respectively. As expected, the potential barrier decreased with increasing spike thickness.

Figure 7:
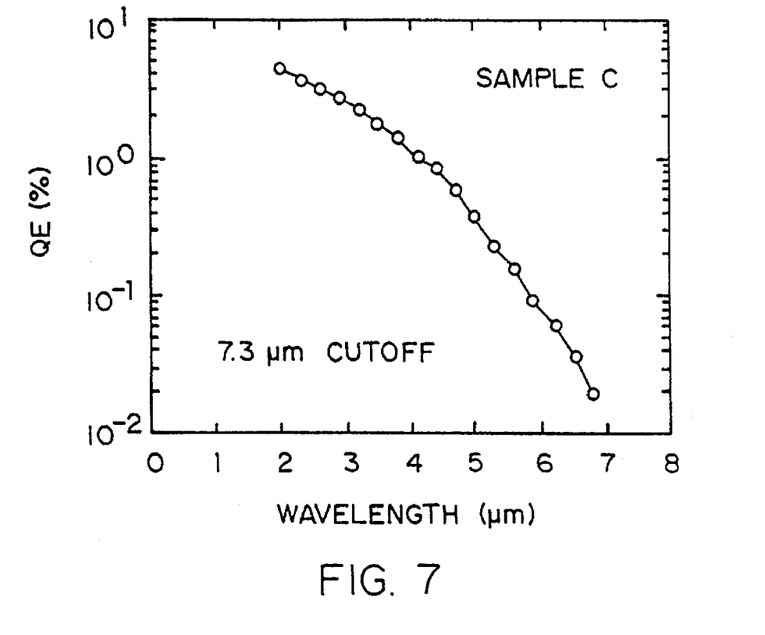
FIG. 7 is a graph of the spectral response of a typical 7.3 µm cutoff backside-illuminated doping-spike PtSi detector without an optical cavity or anti-reflection coating.
Figure 8A:
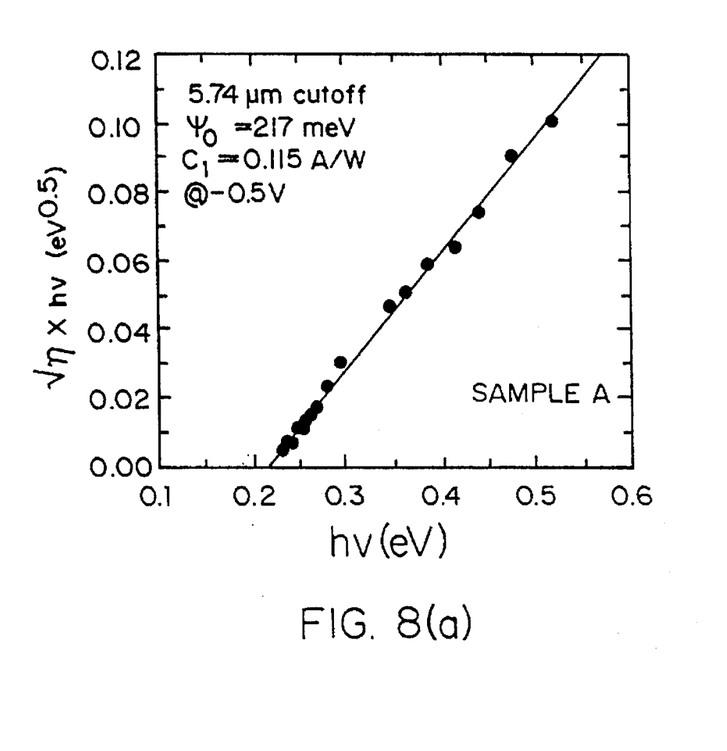
Figure 8B:
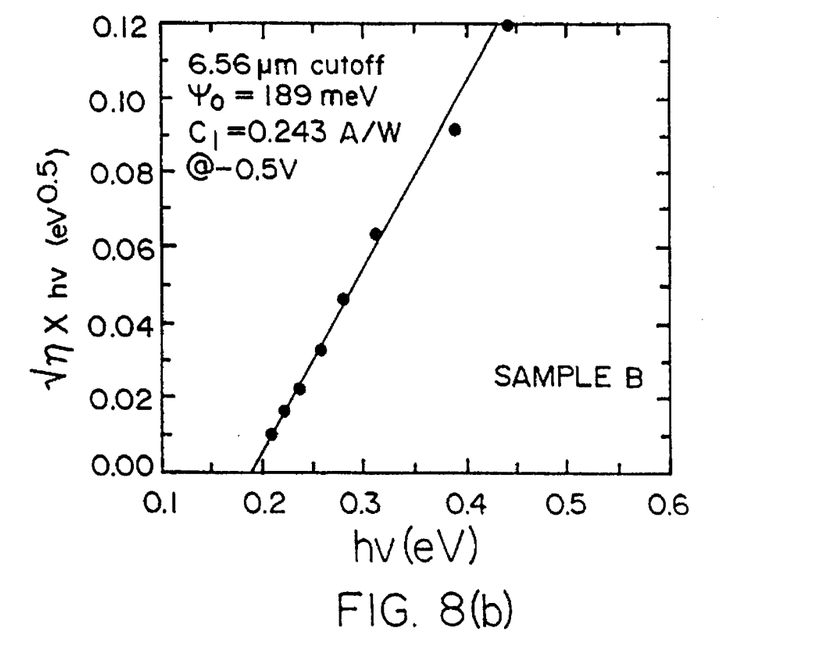
Figure 8C:
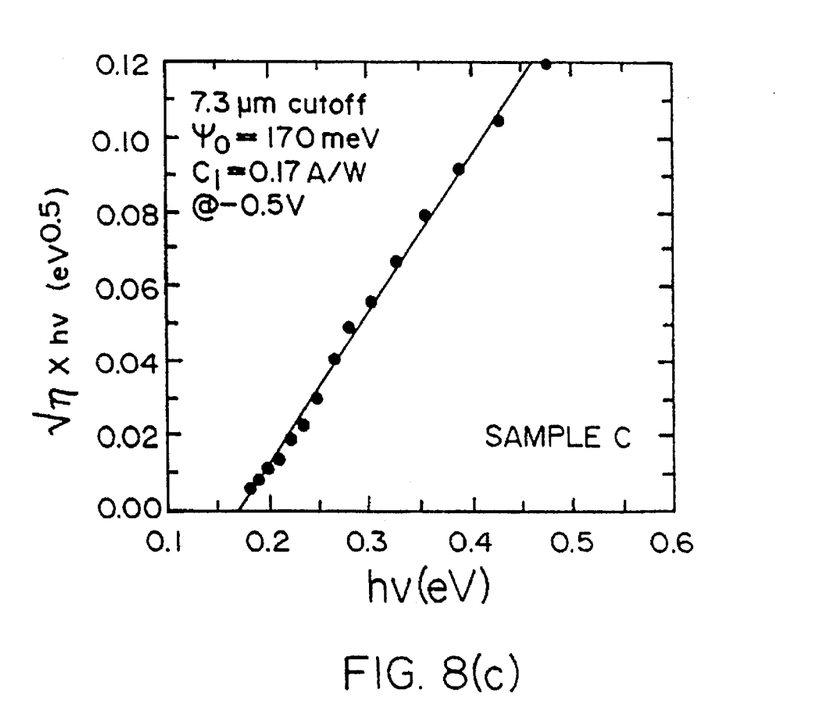

The spectral response was measured with back-side illumination using a blackbody source. The detectors were cooled to 40 K and biased at 0.5 V. FIG. 7 shows the external QE of sample C as a function of the wavelength. The detector was responsive at wavelengths beyond the 5.5 μm cutoff of the conventional PtSi detector. The cutoff wavelength of sample C was determined to be 7.3 μm by the modified Fowler plot. The plots of $\sqrt{\eta h\nu}$ versus hv for these detectors are shown in FIG. 8. Optical potential barriers $\psi_o$ of 0.217, 0.189, and 0.170 eV were determined from the linear portions of the plots, corresponding to cutoff wavelengths of 5.7, 6.6, and 7.3 μm for sample A, B, and C, respectively. The differences between the optical and the thermal barriers were small for these doping-spike PtSi detectors, suggesting that the photo-excited carriers suffered less inelastic scattering in these PtSi layers. The thermal potential barriers $\psi_T$, the Richardson constants A**, the optical potential barriers $\psi_o$, the cut off wavelength $\lambda_c$, and the emission coefficient $C_1$ for these doping-spike PtSi detectors are shown in TABLE 1.

TABLE 1

| | spike thickness (nm) | Thermal potential $\Psi_t$ (eV) | A** (Acm$^{-2}$K$^{-2}$) | Optical potential $\Psi_o$ (eV) | $C_1$ (A/W) | $\lambda_c$ (μm) |
|---|---|---|---|---|---|---|
| A | 0.7 | 0.218 | 46.3 | 0.217 | 0.12 | 5.74 |
| B | 0.9 | 0.193 | 72.8 | 0.189 | 0.23 | 6.56 |
| C | 1.1 | 0.166 | 12.0 | 0.170 | 0.17 | 7.30 |

Having thus described preferred embodiments of the detector and fabrication method of the invention, we claim the following:

1. A method of fabricating a PtSi Schottky infrared detector comprising the steps of:
 a) providing a Si substrate;
 b) depositing less than 2 nm thick layer of p-doped Si onto said substrate; and
 c) depositing a layer of PtSi on said p-doped Si layer by co-evaporating Pt and Si in a 1:1 ratio while the substrate is held at a temperature of about 450 degrees C.

2. The method recited in claim 1 wherein step b) is carried out by molecular beam epitaxy growing said p-doped Si on said substrate.

3. The method recited in claim 2 wherein said molecular beam epitaxy is carried out at a temperature of about 450 degrees C.

4. The method recited in claim 1 wherein step c) is further carried out by annealing said Pt and Si at a temperature of about 400 degrees C.

5. The method recited in claim 1 wherein step b) is carried out by using elemental boron as a deposit source in the range of $1 \times 10^{19}$ to $1 \times 10^{21}$ cm$^{-3}$.

6. The method recited in claim 1 wherein step c) is carried out until a PtSi layer of about 2 to 4 nm is deposited.

7. A method of fabricating a PtSi Schottky infrared detector comprising the steps of:
 a) providing a Si substrate;
 b) depositing less than a 10 nm thick layer of p-doped Si onto said substrate; and
 c) depositing a layer of PtSi on said p-doped Si layer by co-evaporating Pt and Si in a 1:1 ratio while the substrate is held at a temperature of about 450 degrees C.

8. The method recited in claim 7 wherein step b) is carried out by molecular beam epitaxy growing said p-doped Si on said substrate.

9. The method recited in claim 7 wherein said molecular beam epitaxy is carried out at a temperature of about 450 degrees C.

10. The method recited in claim 7 wherein step c) is further carried out by annealing said Pt and Si at a temperature of about 400 degrees C.

11. The method recited in claim 7 wherein step b) is carried out by using elemental boron as a deposit source in the range $1 \times 10^{19}$ to $1 \times 10^{21}$ cm$^{-3}$.

12. The method recited in claim 7 wherein step c) is carried out until a PtSi layer of about 2 to 4 nm is deposited.

* * * * *